United States Patent
Liu et al.

(10) Patent No.: US 8,912,619 B2
(45) Date of Patent: Dec. 16, 2014

(54) ULTRA-VIOLET LIGHT SENSING DEVICE AND MANUFACTURING METHOD THEREOF

(71) Applicants: Han-Chi Liu, Hsin-Chu (TW); Huan-Kun Pan, Hsin-Chu (TW); Eiichi Okamoto, Hsin-Chu (TW)

(72) Inventors: Han-Chi Liu, Hsin-Chu (TW); Huan-Kun Pan, Hsin-Chu (TW); Eiichi Okamoto, Hsin-Chu (TW)

(73) Assignee: Pixart Imaging Incorporation, Hsin-Chu (TW)

( * ) Notice: Subject to any disclaimer, the term of this patent is extended or adjusted under 35 U.S.C. 154(b) by 67 days.

(21) Appl. No.: 13/907,437

(22) Filed: May 31, 2013

(65) Prior Publication Data

US 2013/0341690 A1     Dec. 26, 2013

(30) Foreign Application Priority Data

Jun. 20, 2012   (TW) ............................... 101121989 A

(51) Int. Cl.
*H01L 33/00* (2010.01)
*H01L 21/00* (2006.01)
*H01L 31/0248* (2006.01)

(52) U.S. Cl.
CPC ................................ *H01L 31/0248* (2013.01)

USPC ..... 257/461; 257/463; 257/464; 257/E31.089; 438/48

(58) Field of Classification Search
USPC ............ 257/461, 463, 464, E31.089, E31.09; 438/48, 87
See application file for complete search history.

(56) References Cited

U.S. PATENT DOCUMENTS 7,388,187 B1 * 6/2008 Liu et al. .................... 250/214.1
8,368,130 B2 * 2/2013 Ko et al. ....................... 257/292

* cited by examiner

*Primary Examiner* — Minh-Loan Tran
(74) *Attorney, Agent, or Firm* — Tung & Associates

(57) ABSTRACT

The present invention provides an ultra-violet light sensing device. The ultra-violet light sensing device includes a first conductivity type substrate, a second conductivity type region, and a first conductivity type high density region. The first conductivity type substrate includes a light incident surface. The second conductivity type region is disposed in the first conductivity type substrate and adjacent to the light incident surface. The first conductivity type high density region is disposed under the second conductivity type region. The present invention also provides another ultra-violet light sensing device, which further includes a first conductivity type high density shallow region which is sandwiched between the light incident surface and the second conductivity type region. Manufacturing methods for these ultra-violet light sensing devices are also disclosed in the present invention.

20 Claims, 4 Drawing Sheets

ULTRA-VIOLET LIGHT SENSING DEVICE AND MANUFACTURING METHOD THEREOF

CROSS REFERENCE

The present invention claims priority to TW 101121989, filed on Jun. 20, 2012.

BACKGROUND OF THE INVENTION

1. Field of Invention

The present invention relates to an ultra-violet light sensing device, especially an ultra-violet light sensing device with high signal/noise (S/N) ratio.

2. Description of Related Art

Traditional semiconductor based light sensing devices like photo diode are usually used for sensing visible light or infrared light. As for the ultra-violet light, because of its shorter wavelength band (0 nm~400 nm), the ultra-violet light can only penetrate shallow semiconductor region to induce photoelectrons. However, visible light or infrared light can penetrate deeper semiconductor region to induce photoelectrons, and the induced photoelectrons could drift to the shallow semiconductor region which could interfere the sensing result for the ultra-violet light, because both the drifting photoelectrons and the induced photoelectrons are present in the shallow semiconductor region. In order to improve the S/N ratio in sensing the ultra-violet light, conventional technique utilizes a multilayer filter on the light sensing device, to filter light of undesired wavelength band to prevent it from entering the light sensing device. If the received light contains only the ultra-violet light band, the sensing result is better because there is less interference by the light of longer wavelength band.

However, the yield rate of the multilayer filter manufacturing process is poor. There is a loss in the deposition process for each layer of the filter, and more number of the layers causes more loss in the manufacturing process. Further, the material of the multilayer filter is expensive because precious metal like silver is used, so every manufacturing loss will result in a considerable cost. Therefore, it is desired to improve the S/N ratio of the ultra-violet sensing device, to reduce the manufacturing cost, and to improve the yield rate in the manufacturing process.

SUMMARY OF THE INVENTION

The present invention provides an ultra-violet light sensing device with improved sensing quality of ultra-violet light to increase the S/N ratio.

The above and other purposes and benefits of the present invention can be better understood from the detailed description below.

To the above purposes, the present invention provides an ultra-violet light sensing device, which for example can be used in a three-transistor image sensing circuit. The ultra-violet light sensing device comprises: a substrate of a first conductivity type, a region of a second conductivity type, and a high density region of a first conductivity type. The first conductivity type substrate includes a light incident surface. The second conductivity type region is disposed in the first conductivity type substrate and adjacent to the light incident surface. The first conductivity type high density region is disposed under and adjacent to the second conductivity type region.

In a preferable embodiment of the present invention, another ultra-violet light sensing device for use in a three-transistor image sensing circuit is provided. Preferably, the ultra-violet light sensing device further comprises a high density region of a second conductivity type which is disposed under and adjacent to the first conductivity type high density region.

In another preferable embodiment of the present invention, the ultra-violet light sensing device is for use in a four-transistor image sensing circuit. Preferably, the ultra-violet light sensing device comprises: a substrate of a first conductivity type, a high density shallow region of the first conductivity type, a region of a second conductivity type, and a high density region of the first conductivity type. The first conductivity type substrate includes a light incident surface. The first conductivity type high density shallow region is disposed in the first conductivity type substrate and adjacent to the light incident surface. The second conductivity type region is disposed under and adjacent to the first conductivity type high density shallow region. The first conductivity type high density region is disposed under and adjacent to the second conductivity type region.

In a preferable embodiment of the present invention, another ultra-violet light sensing device for use in a four-transistor image sensing circuit is provided. Preferably, the ultra-violet light sensing device further comprises a high density region of the second conductivity type which is disposed under and adjacent to the first conductivity type high density region.

In a preferable embodiment of the present invention, a manufacturing method of the ultra-violet light sensing device is provided. The manufacturing method comprises: first providing a substrate of a first conductivity type which includes a light incident surface; forming a region of a second conductivity type under and adjacent to the light incident surface; and forming a high density region of the first conductivity type under and adjacent to the second conductivity type region.

In another preferable embodiment of the present invention, a manufacturing method of the ultra-violet light sensing device is provided. Compared to the aforementioned embodiment, the manufacturing method further comprises: forming a high density region of the second conductivity type under and adjacent to the first conductivity type high density region.

According to the above, the ultra-violet light sensing device of the present invention utilizes the first conductivity type high density region which is disposed under and adjacent to the second conductivity type region to form an electric potential barrier; the electric potential barrier traps the photoelectrons induced by light of a longer wavelength band, so that these photoelectrons do not drift to the second conductivity type region at a shallower depth, and they do not interfere the signal reading in sensing ultra-violet light. The ultra-violet light sensing device according to the present invention can be manufactured by a standard semiconductor process, so that the production cost is reduced and the manufacturing process is simpler.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustration only, but not drawn according to actual scale. The wordings of orientations in the description such as: above, under, left, or right are for reference to the drawings only.

Figure 1:
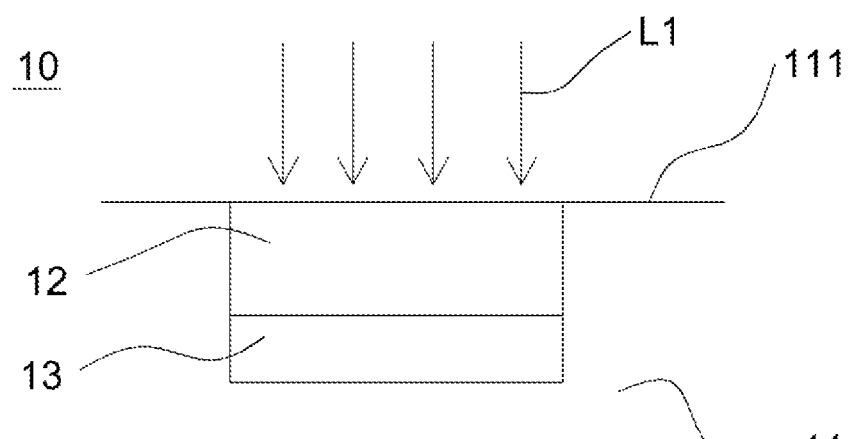
FIG. 1 shows a cross section view of a preferable embodiment of an ultra-violet light sensing device according to the present invention, which for example can be used in an image sensing circuit.

FIG. 1 shows the cross section view of an embodiment of an ultra-violet light sensing device of the present invention, which can be used for example but not limited in a three-transistor (3T) image sensing circuit (not shown). The ultra-violet light sensing device 10 comprises: a substrate 11 of a first conductivity type, a region 12 of a second conductivity type, and a high density region 13 of the first conductivity type. The high density region 13 has a higher impurity density than the substrate 11. The first conductivity type substrate 11 includes a light incident surface 111 for receiving a light L1. The second conductivity type region 12 is disposed in the first conductivity type substrate 11 and adjacent to the light incident surface 111. The first conductivity type high density region 13 is disposed under and adjacent to the second conductivity type region 12. As such, the drifting photoelectron induced by light of a longer wavelength (i.e., longer than the ultra-violet wavelength band) at a deeper depth below the first conductivity type high density region 13 will be trapped and isolated from the second conductivity type region 12 by an electric potential barrier formed by the first conductivity type high density region 13. Therefore, the influence from light of an undesired wavelength band in the light L1 can be excluded, and the S/N ratio for sensing the ultra-violet light can be improved.

Figure 2:
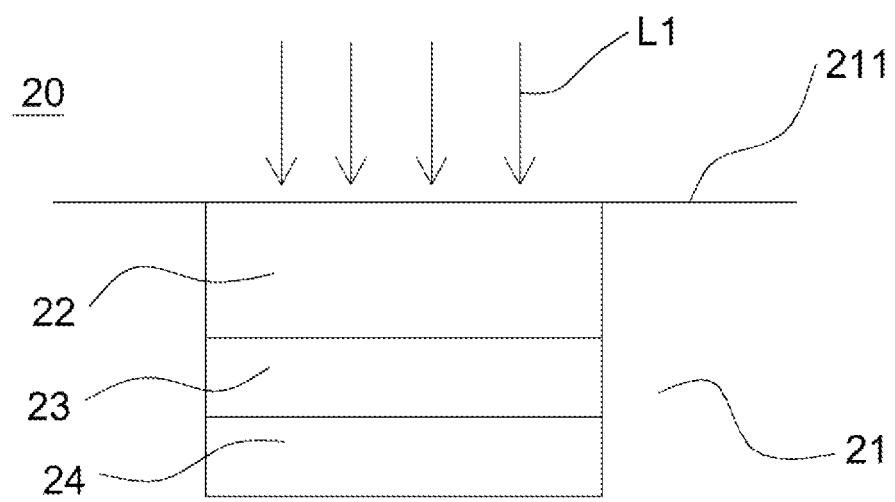
FIG. 2 shows a cross section view of another preferable embodiment of an ultra-violet light sensing device according to the present invention.

FIG. 2 shows across section view of another embodiment of an ultra-violet light sensing device according to the present invention. Similar to the embodiment of FIG. 1, the ultra-violet light sensing device 20 can be used but not limited in a three-transistor (3T) image sensing circuit (not shown). The ultra-violet light sensing device 20 comprises: a substrate 21 of a first conductivity type, a region 22 of a second conductivity type, a high density region 23 of the first conductivity type, and a high density region 24 of the second conductivity type. The high density region 23 has a higher impurity density than the substrate 21 and the high density region 24 has a higher impurity density than the region 22. The first conductivity type substrate 21 includes a light incident surface 211 for receiving a light L1. Compared with the embodiment of FIG. 1, the ultra-violet light sensing device 20 further comprises the second conductivity type high density region 24. The second conductivity type high density region 24 is disposed under and adjacent to the first conductivity type high density region 23. The purpose of this structure is to create a low electric potential trap by the second conductivity type high density region 24, besides the high electric potential barrier formed by the first conductivity type high density region 23. Thus, the drifting photoelectrons induced by light of a longer wavelength will be trapped in this region and more difficult to drift over the electric potential barrier to reach the second conductivity type region 22, i.e., the barrier effect is reinforced. The combination of the first conductivity type high density region 23 and the second conductivity type high density region 24 can further reduce the interference of the photoelectrons induced by light of a longer wavelength.

In the two embodiments shown in FIGS. 1 and 2, the second conductivity type regions 12 and 22, and the second conductivity type high density region 24 for example can be N-type doped regions; the dopant for example can be phosphorus or arsenic. And, the first conductivity type high density region 13 and 23 can be P-type doped regions, and the dopant for example can be boron.

Figure 3:
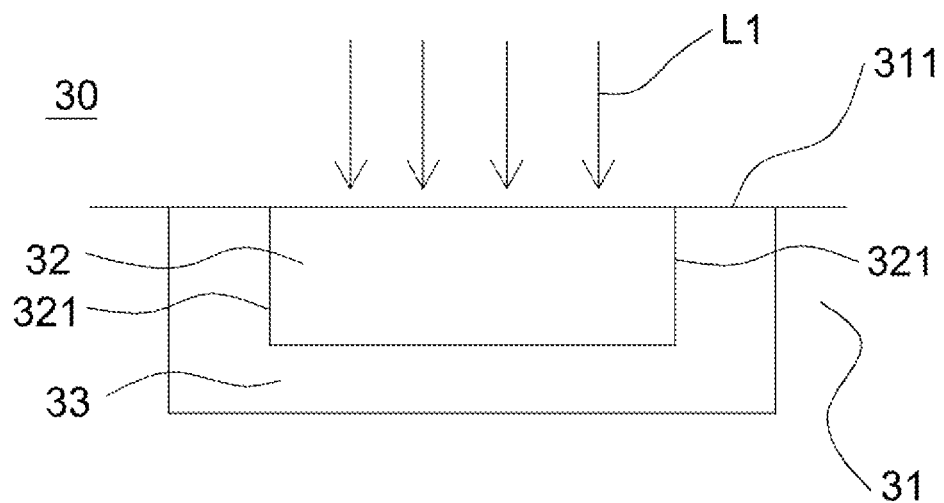
FIG. 3 shows a cross section view of another preferable embodiment of an ultra-violet light sensing device according to the present invention.

FIG. 3 shows a section view of another embodiment of the ultra-violet light sensing device according to the present invention. The ultra-violet light sensing device 30 for example can be used in a three-transistor (3T) image sensing circuit (not shown). Similar to the embodiment of FIG. 1, the ultra-violet light sensing device 30 comprises: a substrate 31 of a first conductivity type, a region 32 of a second conductivity type, and a high density region 33 of the first conductivity type. The high density region 33 has a higher impurity density than the substrate 31. The first conductivity type substrate 31 includes a light incident surface 311 for receiving a light L1. The first conductivity type high density region 33 is disposed under and adjacent to the second conductivity type region 32; the first conductivity type high density region 33 encompasses the sides walls 321 of the second conductivity type region 32, and extends to the light incident surface 311 to form a surrounding well. In this structure, the first conductivity type high density region 33 can be coupled to a predetermined voltage, to reinforce the barrier effect on photoelectrons from light of a longer wavelength. From the perspective of manufacturing process, the opening on the mask for forming the second conductivity type region 32 is smaller than the opening on the mask for forming the first conductivity type high density region 33.

Figure 4:
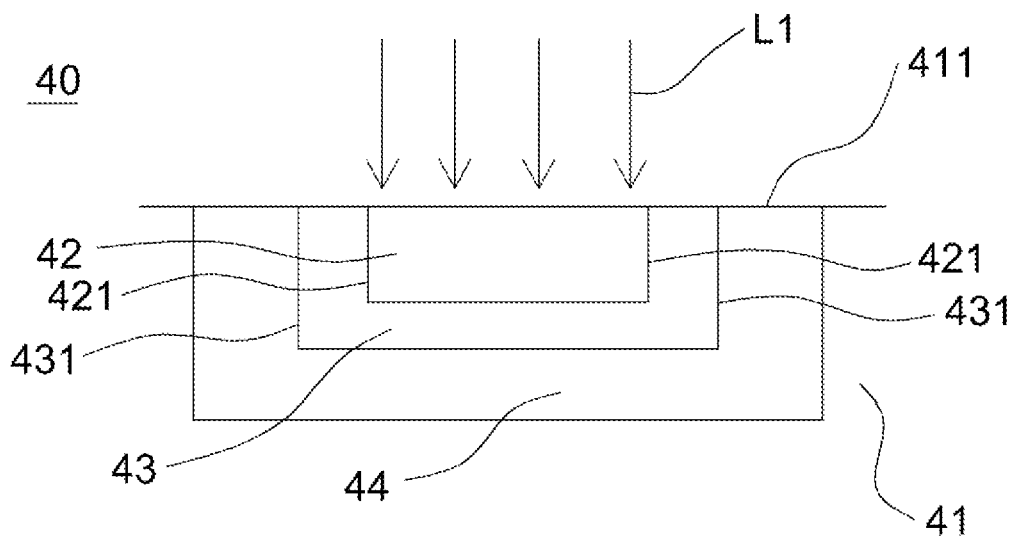
FIG. 4 shows a cross section view of yet another preferable embodiment of an ultra-violet light sensing device according to the present invention.

FIG. 4 shows across section view of another embodiment of a ultra-violet light sensing device according to the present invention, wherein the ultra-violet light sensing device 40 for example can be used in a three-transistor (3T) image sensing circuit (not shown). Similar to the embodiment of FIG. 2, the ultra-violet light sensing device 40 comprises a substrate 41 of a first conductivity type, a region 42 of a second conductivity type, a high density region 43 of the first conductivity type, and a high density region 44 of the second conductivity type. The high density region 43 has a higher impurity density than the substrate 41 and the high density region 44 has a higher impurity density than the region 42. The first conductivity substrate 41 includes a light incident surface 411, and the light incident surface 411 receives a light L1. The second conductivity type region 42 is disposed in the first conductivity substrate 41 and adjacent to the light incident surface 411. The first conductivity type high density region 43 is under and adjacent to the second conductivity type region 42. The first conductivity type high density region 43 encompasses the side walls 421 of the second conductivity region 42 and extends to the light incident surface 411, to form a surrounding well. The second conductivity type high density region 44 is under and adjacent to the first conductivity type high density region 43, and encompasses the side walls 431 of the first conductivity type high density region 43; it extends to the light incident surface 411 to form a surrounding well. The first conductivity type high density region 43 and the second conductivity type high density region 44 can be respectively coupled to different predetermined voltages to reinforce the barrier effect on the photoelectrons induced by light of a longer wavelength. From the perspective of manufacturing process, the opening on the mask for forming the second conductivity type region 42 is smaller than the opening on the mask for forming the first conductivity type high density region 43, and the opening on the mask for forming the first conductivity type high density region 43 is smaller than the opening on the mask for forming the second conductivity type high density region 44.

Referring to the embodiments of FIGS. 1, 2, 3 and 4, the depth of the second conductivity type region (its distance from the light incident surface) is preferably in a range between 0.2 μm and 2 μm, that is, deeper than or equal to 0.2 μm and shallower than or equal to 2 μm. The depth of the first conductivity type high density region (its distance from the light incident surface) is preferably in a range between 0.6 μm and 3 μm, that is, deeper than or equal to 0.6 μm and shallower than or equal to 3 μm. The depth of the second conductivity type high density region (its distance from the light incident surface) is preferably in a range between 3 μm and 6 μm under the light incident surface, that is, deeper than or equal to 3 μm and shallower than or equal to 6 μm.

Figure 5:
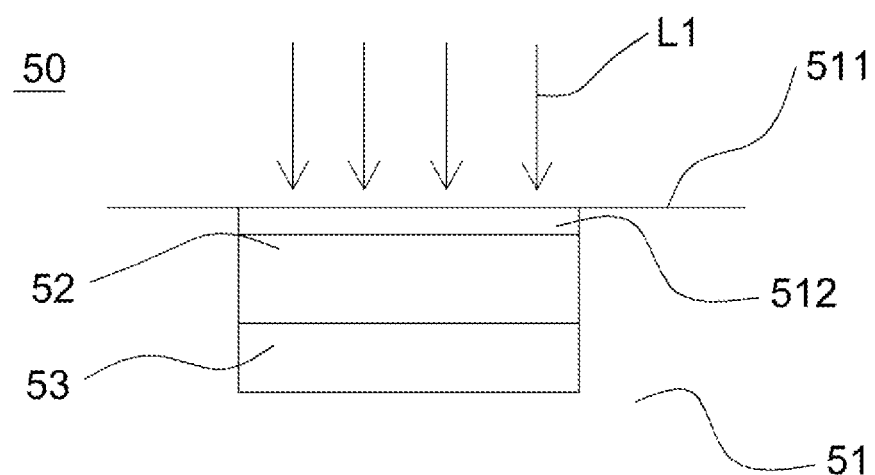
FIG. 5 shows a cross section view of a preferable embodiment of another ultra-violet light sensing device according to the present invention.

FIG. 5 shows a cross section view of an embodiment of another ultra-violet light sensing device according to the present invention is shown. The ultra-violet light sensing device 50 for example can be used in, but not limited to, a four-transistor (4T) image sensing circuit (not shown). The ultra-violet light sensing device 50 comprises: a substrate 51 of a first conductivity type, a high density shallow region 512 of the second conductivity type, a region 52 of a second conductivity type, and a high density region 53 of the second conductivity type. The high density shallow region 512 has a higher impurity density than the substrate 51 and the high density region 53 has a higher impurity density than the region 52. The first conductivity type substrate 51 includes a light incident surface 511 for receiving a light L1. The first conductivity type high density shallow region 512 is disposed in the first conductivity type substrate 51 and adjacent to the light incident surface 511. The second conductivity type region 52 is disposed under and adjacent to the first conductivity type high density shallow region 512. The first conductivity type high density region 53 is disposed under and adjacent to the second conductivity type region 52. The first conductivity type high density shallow region 512 is provided to couple to a four-transistor image sensing circuit. The rest of the device is similar to the embodiment of FIG. 1.

Figure 6:
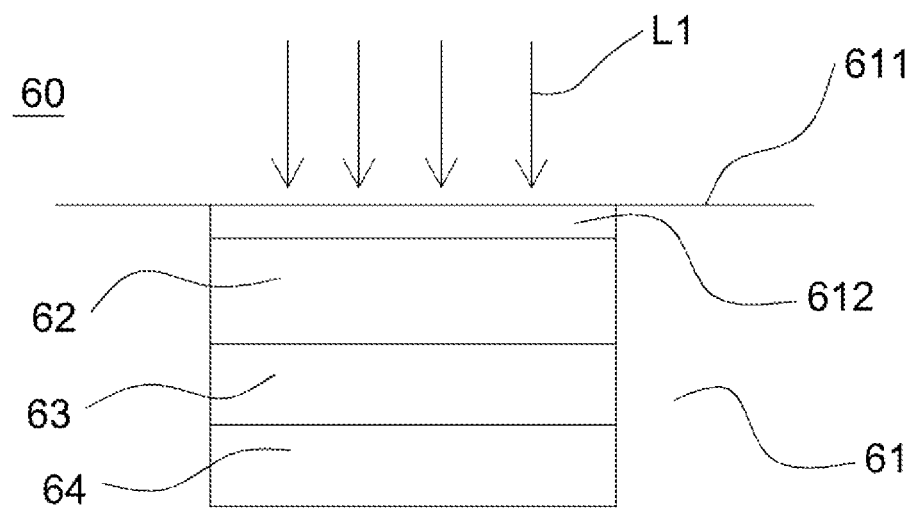
FIG. 6 shows a cross section view of another preferable embodiment of an ultra-violet light sensing device according to the present invention.

FIG. 6 shows another embodiment of an ultra-violet light sensing device of the present invention. Similar to the embodiment of FIG. 5, the ultra-violet light sensing device 60 for example can be used, but not limited in, a four-transistor image sensing circuit (not shown). The ultra-violet light sensing device 60 comprises: a substrate 61 of a first conductivity type, a high density shallow region 612 of the first conductivity type, a region 62 of a second conductivity type, a high density region 63 of the first conductivity type, and a high density region 64 of the second conductivity type. The high density shallow region 612 has a higher impurity density than the substrate 61 and the high density region 64 has a higher impurity density than the region 62. The first conductivity type substrate 61 includes a light incident surface 611 for receiving a light L1. The first conductivity type high density shallow region 612 is disposed in the first conductivity type substrate 61 and adjacent to the light incident surface 611. The second conductivity type region 62 is disposed under and adjacent to the first conductivity type high density shallow region 612. The first conductivity type high density region 63 is disposed under and adjacent to the second conductivity type region 62. The second conductivity type high density region 64 is disposed under and adjacent to the first conductivity type high density region 63. Compared to FIG. 5, the ultra-violet light sensing device 60 further comprises the second conductivity type high density region 64. The purpose of the second conductivity type high density region 64 is to create a low electric potential trap by the second conductivity type high density region 64, besides the high electric potential barrier formed by the first conductivity type high density region 63. The combination of the electric potential trap and barrier makes the photoelectrons induced by light of a longer wavelength more difficult to drift into the second conductivity region 62.

In the two embodiments shown in FIGS. 5 and 6, the second conductivity type region 52 and 62, and the second conductivity type high density region 64 for example can be N-type doped regions; the dopant for example can be phosphorus or arsenic. And, the first conductivity type region 51 and 61 can be P-type doped region, and the dopant for example can be boron.

Figure 7:
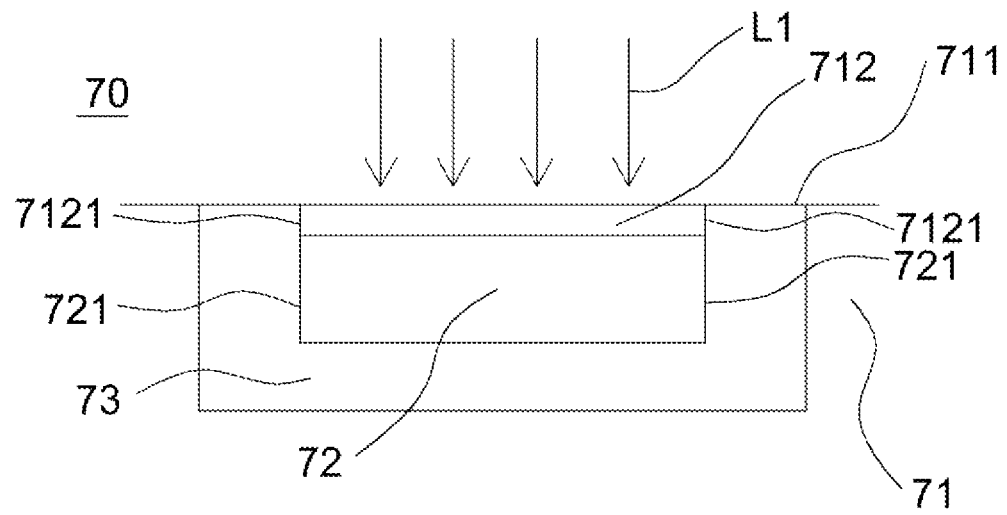
FIG. 7 shows a cross section view of another preferable embodiment of an ultra-violet light sensing device according to the present invention.

FIG. 7 shows a cross section view according to yet another embodiment of an ultra-violet light sensing device of the present invention. The ultra-violet light sensing device 70 for example can be used in a four-transistor image sensing circuit (not shown). The ultra-violet light sensing device 70 comprises: a substrate 71 of a first conductivity type, a high density shallow region 712 of the first conductivity type, a region 72 of a second conductivity type, and a high density region 73 of the first conductivity type. The high density shallow region 712 and the high density region 73 each has a higher impurity density than the substrate 71. The first conductivity type substrate 71 includes a light incident surface 711 for receiving a light L1. The first conductivity type high density shallow region 712 is disposed in the first conductivity type substrate 71 and adjacent to the light incident surface 711. The second conductivity type region 72 is disposed under and adjacent to the first conductivity type high density shallow region 712. The first conductivity type high density region 73 is disposed under and adjacent to the second conductivity type region 72, and encompasses the side walls 721 of the second conductivity region 72 and the side walls 7121 of the first conductivity type high density shallow region 712; it extends to the light incident surface 711, to form a surrounding well. The first conductivity type high density shallow region 712 is provided to couple to a four-transistor image sensing circuit, and the first conductivity type high density region 73 can be coupled to a predetermined voltage to reinforce the barrier effect on photoelectrons induced by light of a longer wavelength. The rest of the device is similar to the embodiments of FIGS. 1 and 5.

Figure 8:
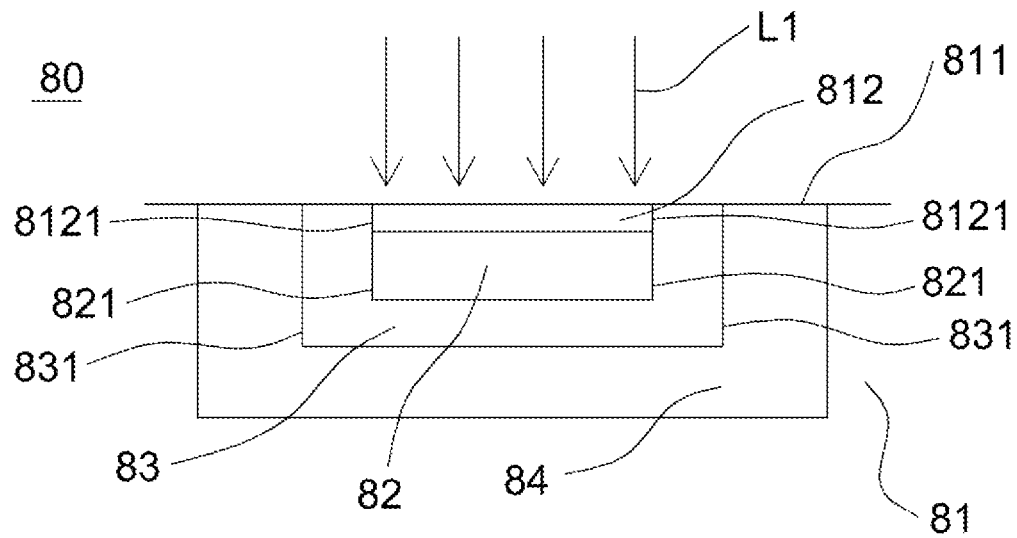
FIG. 8 shows a cross section view of yet another preferable embodiment of an ultra-violet light sensing device according to the present invention.

FIG. 8 shows across section view of another embodiment of an ultra-violet light sensing device of the present invention. The ultra-violet light sensing device 80 for example can be used in, but not limited to, a four-transistor (4T) image sensing circuit (not shown). The ultra-violet light sensing device 80 comprises a substrate 81 of a first conductivity type, a high density shallow region 812 of the first conductivity type, a region 82 of a second conductivity type, and a high density region 83 of the first conductivity type. The high density shallow region 812 and the high density region 83 each has a higher impurity density than the substrate 81. The first conductivity type substrate 81 includes a light incident surface 811 for receiving a light L1. The first conductivity type high density shallow region 812 is disposed in the first conductivity type substrate 81 and adjacent to the light incident surface 811. The second conductivity type region 82 is disposed under and adjacent to the first conductivity type high density shallow region 812. The first conductivity type high density region 83 is disposed under and adjacent to the second conductivity type region 82, and encompasses the side walls 821 of the second conductivity doped region 82 and the side walls 8121 of the first conductivity type high density shallow region 812; it extends to the light incident surface 811, to form a surrounding well. The second conductivity type high density region 84 is disposed under and adjacent to the first conductivity type high density region 83, and encompasses the side walls 831 of the first conductivity type high density region 83; it extends to the light incident surface 811, to form a surrounding well. The first conductivity type high density region 83 and the second conductivity type high density region 84 can be respectively coupled to different predetermined voltages to reinforce the barrier effect on photoelectrons induced by light of a longer wavelength. The rest of the device is similar to the embodiments of FIGS. 4 and 7.

Referring to the embodiments of FIGS. 5, 6, 7 and 8, the depth of the first conductivity type high density shallow region (its distance from the light incident surface) is preferably in a range between 0.02 μm and 0.1 μm, that is, deeper than or equal to 0.02 μm and shallower than or equal to 0.1 μm. The depth of the second conductivity type region (its distance from the light incident surface) is preferably in a range between 0.05 μm and 0.2 μm, that is, deeper than or equal to 0.05 μm and shallower than or equal to 0.2 μm. The depth of the first conductivity type high density region (its distance from the light incident surface) is preferably in a range between 0.05 μm and 0.5 μm, that is, deeper than or equal to 0.05 μm and shallower than or equal to 0.5 μm. The depth of the second conductivity type high density region (its distance from the light incident surface) is preferably in a range between 0.1 μm and 1 μm, that is, deeper than or equal to 0.1 μm and shallower than or equal to 1 μm.

The present invention also provides a manufacturing method of the above ultra-violet light sensing devices, and an embodiment for manufacturing the ultra-violet light sensing device 10 will first be described as an example.

First, a first conductivity type substrate 11 is provided, which includes a light incident surface 111. The area to be implanted is defined by a mask (not shown), and a second conductivity type region 12 is formed in the first conductivity type substrate 11 by ion implantation, wherein the second conductivity type region 12 is under and adjacent to the light incident surface 111. And, a first conductivity type high density region 13 is formed by ion implantation, wherein the first conductivity type high density region 13 is under and adjacent to the second conductivity type region 12. The step for forming the second conductivity type region 12 and the step for forming the first conductivity type high density region 13 can be performed by any sequential order, and they can use the same mask.

Referring to FIG. 2, besides the steps similar to those for manufacturing the ultra-violet light sensing device 10 in FIG. 1, the manufacturing method of the ultra-violet light sensing device 20 further comprises: forming a second conductivity type high density region 24 under and adjacent to the first conductivity type high density region 23. the step for forming the second conductivity type region 22, the step for forming the first conductivity type high density region 23, and the step for forming the second conductivity type high density region 24 can be performed by any sequential order, and they can use the same mask.

Referring to FIG. 3, the ultra-violet light sensing device 30 can be manufactured by steps similar to those for manufacturing the ultra-violet light sensing device 10 shown in FIG. 1. The step for forming the second conductivity type region 32 and the step for forming the first conductivity type high density region 33 can be performed by any sequential order; however preferably, they should use different masks or adopt different lengths of time for the diffusion of the impurities.

Referring to FIG. 4, the ultra-violet light sensing device 40 can be manufactured by steps similar to those for manufacturing the ultra-violet light sensing device 20 shown in FIG. 2. The step for forming the second conductivity type region 42 and the step for forming the first conductivity type high density region 43 can be performed by any sequential order; however preferably, they should use different masks or adopt different lengths of time for the diffusion of the impurities.

FIG. 5 shows another embodiment of the manufacturing method according to the present invention, taking the ultra-violet light sensing device 50 as an example.

First, a first conductivity type substrate 51 is provided, which includes a light incident surface 511. The area to be implanted is defined by a mask (not shown), and a first conductivity type high density shallow region 512 is formed under the light incident surface 511 by ion implantation. A second conductivity type region 52 is formed under and adjacent to first conductivity type high density shallow region 512 by ion implantation, and a first conductivity type high density region 53 is formed under and adjacent to the second conductivity type region 52 by ion implantation. The step for forming the first conductivity type high density shallow region 512, the step for forming the second conductivity type region 52, and the step for forming the first conductivity type high density region 53 can be performed by any sequential order, and they can use the same mask.

Referring to FIG. 6, besides the steps similar to those for manufacturing the ultra-violet light sensing device 50 in FIG. 5, the manufacturing method of the ultra-violet light sensing device 60 further comprises: forming a high density second conductivity type shallow region 64 under the first conductivity type high density region 63. The step for forming the first conductivity type high density shallow region 612, the step for forming the second conductivity type region 62, the step for forming the first conductivity type high density region 63, and the step for forming the second conductivity type high density region 64 can be performed by any sequential order, and they can use the same mask.

Referring to FIG. 7, the ultra-violet light sensing device 70 can be manufactured by steps similar to those for manufacturing the ultra-violet light sensing device 50 shown in FIG. 5. The step for forming the first conductivity type high density shallow region 712 and the step for forming the second conductivity type region 72 can use the same mask; the mask for forming the first conductivity type high density region 73 preferably uses a different mask, or adopts a different length of time for the diffusion of the impurities. The step for forming the first conductivity type high density shallow region 712, the step for forming the second conductivity type region 72, and the step for forming the first conductivity type high density region 73 can be performed by any sequential order.

Referring to FIG. 8, the ultra-violet light sensing device 80 can be manufactured by steps similar to those for manufacturing the ultra-violet light sensing device 60 shown in FIG. 6. The step for forming the first conductivity type high density shallow region 812 and the step for forming the second conductivity type region 82 can use the same mask; the step for forming the first conductivity type high density region 83 and the step for forming the second conductivity type high density region 84 preferably use different masks or adopt different lengths of time for the diffusion of the impurities. The step for forming the first conductivity type high density shallow region 812, the step for forming the second conductivity type region 82, the step for forming the first conductivity type high density region 83, and the step for forming the second conductivity type high density region 84 can be performed by any sequential order.

To sum up, the ultra-violet light sensing device and the manufacturing method thereof according to the present invention includes at least following benefits: the first conductivity type high density region and the second conductivity type high density region in the ultra-violet light sensing device can trap the drifting photoelectrons induced by light of a longer wavelength, so that a better S/N ratio is obtained when sensing ultra-violet light. Further, the ultra-violet light sensing device can be manufactured by a standard semiconductor process, so the manufacturing cost is effectively reduced and the manufacturing process is simplified.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. An embodiment or a claim of the present invention does not need to achieve all the objectives or advantages of the present invention. The title and abstract are provided for assisting searches but not for limiting the scope of the present invention.

What is claimed is:

1. An ultra-violet light sensing device, comprising:
a substrate of a first conductivity type, including a light incident surface for receiving light;
a region of a second conductivity type, disposed in the first conductivity type substrate and adjacent to the light incident surface; and
a high density region of the first conductivity type, disposed under and adjacent to the second conductivity type region, whereby an electric potential barrier is formed in the first conductivity type high density region to isolate photoelectrons induced below the first conductivity type high density region.

2. The ultra-violet light sensing device of claim 1, further comprising a high density region of the second conductivity type, disposed under and adjacent to the first conductivity type high density region, whereby an electric potential trap is formed in the second conductivity type high density region to trap the photoelectrons induced below the first conductivity type high density region.

3. The ultra-violet light sensing device of claim 2, wherein the second conductivity type high density region encompasses side walls of the first conductivity type high density region and extends to the light incident surface.

4. The ultra-violet light sensing device of claim 3, wherein the second conductivity type high density region is coupled to a predetermined voltage.

5. The ultra-violet light sensing device of claim 2, wherein the second conductivity type region has a distance in a range between 0.2 µm and 2 µm from the light incident surface, and the first conductivity type high density region is disposed between 0.6 µm and 3 µm from the light incident surface, and the second conductivity type high density region has a distance in a range between 3 µm and 6 µm from the light incident surface.

6. The ultra-violet light sensing device of claim 1, wherein the first conductivity type high density region encompasses side walls of the second conductivity type region and extends to the light incident surface.

7. The ultra-violet light sensing device of claim 6, wherein the first conductivity type high density region is coupled to a predetermined voltage.

8. The ultra-violet light sensing device of claim 1, wherein the ultra-violet light sensing device is used in a three-transistor image sensing circuit.

9. The ultra-violet light sensing device of claim 1, wherein the ultra-violet light sensing device is used in a four-transistor image sensing circuit.

10. An ultra-violet light sensing device, comprising:
a substrate of a first conductivity type, including a light incident surface for receiving light;
a high density shallow region of the first conductivity type, disposed in the first conductivity type substrate and adjacent to the light incident surface;
a region of a second conductivity type, disposed under and adjacent to the first conductivity type high density shallow region; and
a high density region of the first conductivity type, disposed under and adjacent to the second conductivity type region, whereby an electric potential barrier is formed in the first conductivity type high density region to isolate photoelectrons induced below the first conductivity type high density region.

11. The ultra-violet light sensing device of claim 10, further comprising a high density region of the second conductivity type, disposed under and adjacent to the first conductivity type high density region, whereby an electric potential trap is formed in the second conductivity type high density region to trap photoelectrons induced below the first conductivity type high density region.

12. The ultra-violet light sensing device of claim 11, wherein the second conductivity type high density region encompasses side walls of the first conductivity type high density region and extends to the light incident surface.

13. The ultra-violet light sensing device of claim 12, wherein the second conductivity type high density region is coupled to a predetermined voltage.

14. The ultra-violet light sensing device of claim 10, wherein the first conductivity type high density region encompasses side walls of the second conductivity type region and side walls of the first conductivity type high density shallow region, and extends to the light incident surface.

15. The ultra-violet light sensing device of claim 14, wherein the first conductivity type high density region is coupled to a predetermined voltage.

16. The ultra-violet light sensing device of claim 10, wherein the first conductivity type high density shallow region has a distance in a range between 0.02 µm and 0.1 µm from the light incident surface; the second conductivity type region has a distance in a range between 0.05 µm and 0.2 µm, from the light incident surface; and the first conductivity type high density region has a distance in a range between 0.05 µm, and 0.5 µm from the light incident surface.

17. A manufacturing method of a ultra-violet light sensing device, comprising:
providing a substrate of a first conductivity type, which includes a light incident surface for receiving a light;

forming a region of a second conductivity type under and adjacent to the light incident surface; and forming a high density region of the first conductivity type under and adjacent to the second conductivity type region, whereby an electric potential barrier is formed in the first conductivity type high density region to isolate photoelectrons induced below the first conductivity type high density region.

18. The manufacturing method of claim 17, wherein the step for forming the second conductivity type region and the step for forming the first conductivity type high density region are performed using one same mask.

19. The manufacturing method of claim 17, wherein the first conductivity type high density region encompasses side walls of the second conductivity type region and extends to the light incident surface, and the first conductivity type high density region is coupled to a predetermined voltage.

20. The manufacturing method of claim 17, further comprising:

forming a high density region of the second conductivity type under and adjacent to the first conductivity type high density region, whereby an electric potential trap is formed in the second conductivity type high density region to trap photoelectrons induced below the first conductivity type high density region.

* * * * *